United States Patent [19]

Vinton

[11] 4,377,627
[45] Mar. 22, 1983

[54] MICROMINIATURE SOLID STATE DEVICE MANUFACTURE WITH AUTOMATIC ALIGNMENT OF SUB-PATTERNS

[75] Inventor: David J. Vinton, Burgess Hill, England

[73] Assignee: U.S. Philips Corporation, New York, N.Y.

[21] Appl. No.: 216,340

[22] Filed: Dec. 15, 1980

[30] Foreign Application Priority Data

Dec. 18, 1979 [GB] United Kingdom ............... 7943449

[51] Int. Cl.³ .................... G03C 5/00; G03F 9/00; G01N 21/00; H01L 21/02
[52] U.S. Cl. .................................. 430/22; 430/5; 430/311; 430/313; 430/314; 430/296; 430/319; 430/394; 430/396; 430/494; 430/967
[58] Field of Search ............. 430/22, 5, 311, 313, 430/314, 319, 394, 396, 494, 967, 296

[56] References Cited

U.S. PATENT DOCUMENTS

| | | | |
|---|---|---|---|
| 3,245,794 | 4/1966 | Conley | 430/22 |
| 3,607,267 | 9/1971 | Garrels | 430/312 |
| 3,742,229 | 6/1973 | Smith | 430/967 |
| 4,118,230 | 10/1978 | Binder | 430/319 |

FOREIGN PATENT DOCUMENTS

| | | | |
|---|---|---|---|
| 2708674 | 8/1978 | Fed. Rep. of Germany | 430/22 |
| 1520925 | 8/1978 | United Kingdom | 430/22 |

Primary Examiner—Charles L. Bowers, Jr.
Attorney, Agent, or Firm—Paul R. Miller

[57] ABSTRACT

A semiconductor substrate is mounted in an electron beam image projector with a mask. The patterned electron beam from the mask comprises a first sub-pattern and a second lower intensity sub-pattern. The difference in the intensities of the two sub-patterns permits the automatic alignment of the patterned electron beam relative to the substrate by detecting when the first sub-pattern is incident on a reference marker pattern on the substrate, while the first and second sub-patterns together expose an electron sensitive layer at the entire area of the reference marker pattern. The part of the layer retained after developing can be used as an etchant mask during the definition of a protective layer or the removal of unwanted material from the entire area of the reference marker pattern depending on whether the layer is a negative or a positive electron sensitive material.

14 Claims, 10 Drawing Figures

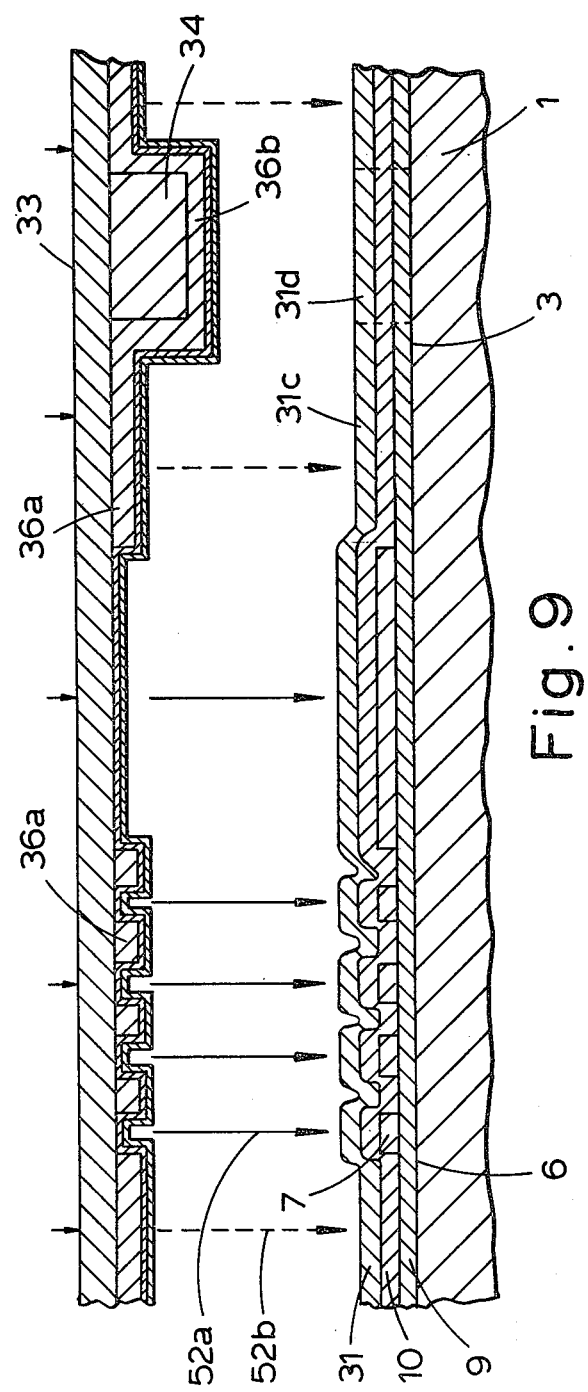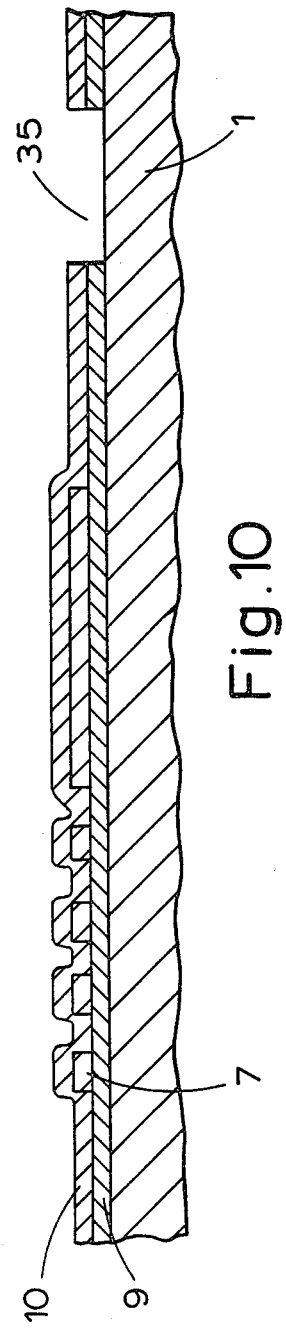

MICROMINIATURE SOLID STATE DEVICE MANUFACTURE WITH AUTOMATIC ALIGNMENT OF SUB-PATTERNS

This invention relates to a method of manufacturing microminiature solid state devices, in which a layer of radiation sensitive material present on a major surface of a substrate is exposed to a patterned radiation beam from a mask.

Well-known microminiature solid state devices are semiconductor devices, for example integrated circuits comprising transistors. Other examples include magnetic bubble devices.

The manufacture of an integrated circuit comprising a bipolar transistor using an electron image projection system is described and shown, by way of example, in United Kingdom Patent Specification No. 1,520,925. A reference marker pattern is provided at an area of a semiconductor substrate and a layer of electron sensitive material is exposed to a patterned electron beam from a mask having a photocathode layer to define areas of the substrate relative to and outside of the area of the reference marker pattern where a processing step is to be effected. The patterned electron beam, which has a uniform intensity comprises a sub-pattern which emanates from an alignment marker pattern on the mask and which has substantially the same configuration as the reference marker pattern on the semiconductor substrate. An X-ray signal derived from the incidence of the sub-pattern on the reference marker pattern is used to align automatically the patterned electron beam with the substrate.

However, at one stage in the manufacture of this integrated circuit a protective layer of silicon nitride is defined over the reference marker pattern.

At another stage a layer portion of polycrystalline silicon is removed from over the reference marker pattern while the surrounding monocrystalline silicon is retained. For this purpose a masking layer is provided on the surface of the device. A window is etched in the masking layer to expose the polycrystalline silicon portion.

At both of these stages the area of material to be removed is defined using a patterned radiation beam from a mask which has an aperture at the area normally occupied by an alignment marker pattern. The aperture and consequently the patterned radiation beam from the mask correspond to the whole area of the silicon nitride layer to be retained or the polycrystalline silicon portion to be removed. Automatic alignment is not possible because the patterned radiation beam does not comprise a part corresponding to the reference marker pattern. Because mechanical alignment can only be carried out coarsely, for example within an accuracy of 50 microns, a large clearance must be allowed between the edge of the aperture in the mask and the edge of the reference marker pattern on the substrate and also between the edge of the aperture and the edge of a scribing lane on the substrate. These clearances, which are typically 60 microns and 40 microns respectively, limit the area of the semiconductor substrate which can be occupied by the reference marker pattern. This has the disadvantage that the accuracy with which automatic alignment can be carried out at other stages is limited because it depends on the strength of the X-ray signal derived from the reference marker pattern. The strength of this signal depends on the area occupied by the reference marker pattern.

According to a first aspect of the invention there is provided a method of manufacturing a microminiature solid state device including the steps of exposing a layer of radiation sensitive material on a major surface of a substrate to a patterned radiation beam from a mask, which patterned radiation beam comprises a first sub-pattern and a second sub-pattern of lower intensity than the first sub-pattern, the first sub-pattern being contained within at least a part of the second sub-pattern and having substantially the same configuration as a reference marker pattern provided at the surface of the substrate, aligning the patterned radiation beam from the mask relative to the substrate so that the first sub-pattern is incident on the reference marker pattern, and continuing the exposure to determine a part of the layer which is to be removed and which is defined by the perimeter of the patterned radiation beam.

The difference in the intensity of the two sub-patterns permits the first sub-pattern to be used for alignment while both the first and the second sub-patterns expose the radiation sensitive material at the entire area of the reference marker pattern.

The patterned radiation beam may be electron radiation or electromagnetic radiation, for example visible light or X-rays, and it may extend over the entire area of the mask.

The layer of radiation sensitive material can be a negative or a positive radiation sensitive material. On developing, a positive radiation sensitive material is removed completely from the whole area of the reference marker pattern. The remaining part of the layer may cover the entire area outside the area of the reference marker pattern. On the other hand, a negative radiation sensitive material is removed completely from an area outside the area of the reference marker pattern. The remaining part of the layer may be limited to cover only the area of the reference marker pattern.

However, with either type of radiation sensitive material the remaining part of the first layer may define outside the area of and relative to the reference marker pattern an aperture corresponding to an area of the substrate where a processing step is to be effected. A single mask can thus be used to define areas of the substrate where a processing step is to be carried out and simultaneously the area of material which is to be removed or retained on the reference marker pattern.

The reference marker pattern on the substrate may be provided without a separate mask by exposing a preliminary layer of positive or negative radiation sensitive material on the surface of the substrate to the patterned radiation beam from the mask, developing the preliminary layer to remove completely a part of it defined by the perimeter of the first sub-pattern, and forming the reference marker pattern at locations where the first sub-pattern was incident as defined by the remaining part of the preliminary layer.

If the preliminary layer is a positive radiation sensitive material the remaining parts mask the surface of the substrate during the provision of the material of the reference marker pattern. The remaining parts of the preliminary layer are then removed together with the parts of the material of the reference marker pattern present thereon so that the remaining parts form the reference marker pattern.

If the preliminary layer is a negative radiation sensitive material the remaining parts mask an underlying layer of the material of the reference marker pattern against an etching treatment so that the remaining parts form the reference marker pattern.

As well as avoiding the need for an additional mask the provision of the reference marker pattern in this way has the advantage that the configuration of the reference marker pattern can be made to correspond accurately to that of the first sub-pattern. The alignment of the radiation pattern from this mask with a reference marker pattern provided in this way can be carried out with great accuracy.

When this method is carried out using a patterned electron beam from a mask comprising a photocathode layer an X-ray signal derived from the incidence of the first sub-pattern on the reference marker pattern may be used to align automatically the first sub-pattern from the mask relative to the substrate.

Automatic alignment takes place during the first part of the exposure time and so the definition of exposed areas depends on the proportion of the total exposure time occupied by alignment. Due to the lower intensity of the second sub-pattern exposure times are longer than those necessary in the known method using a mask with an aperture. The proportion of the total exposure time taken for alignment is thus reduced resulting in better definition of exposed areas.

Automatic alignment can be carried out accurately. This has the advantage that the clearance between the edge of the scribing lane and the reference marker pattern can be reduced. The area which can be occupied by the reference marker pattern is therefore increased so that a stronger X-ray signal can be obtained for more accurate alignment.

According to a further aspect of the invention there is provided a microminiature solid state device manufactured by a method in accordance with the first aspect of the invention.

Embodiments of the invention will now be described, by way of example, with reference to the accompanying drawings, in which:

FIGS. 9 and 10 are cross-sectional views showing parts of a mask and a semiconductor wafer at different stages of a further method in accordance with the invention.

Figure 1:
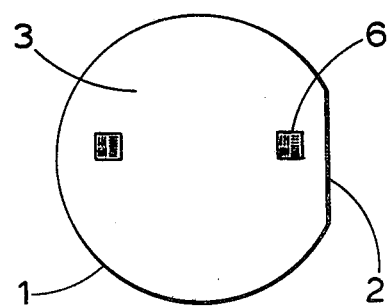
FIG. 1 is a plan view of a semiconductor wafer with two areas having a reference marker pattern on its surface.
Figure 2:
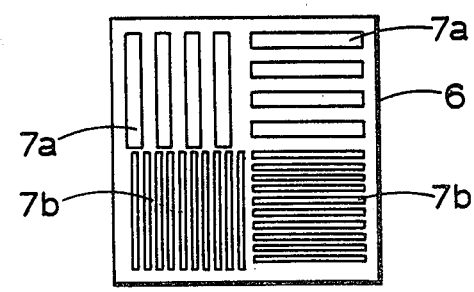
FIG. 2 is a plan view of one of the reference marker patterns of FIG. 1.
Figure 3:
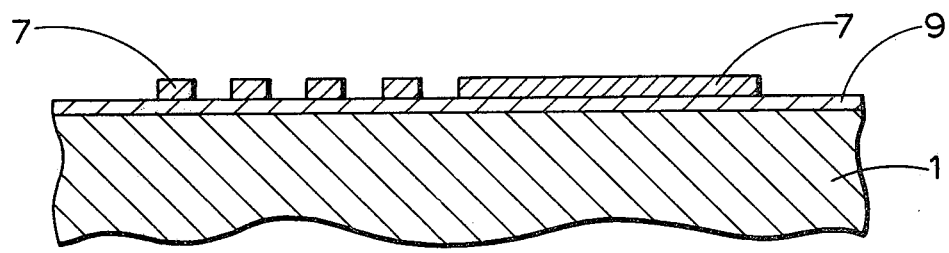
FIG. 3 is a cross-sectional view of the reference marker pattern shown in FIG. 2.

The substrate illustrated in FIG. 1 is in the form of a monocrystalline semiconductor wafer 1 of, for example, silicon. The wafer 1, which has a circular outline with a conventional alignment flat 2, consists of two reference marker areas 6 and an area 3 outside the areas 6. As shown in FIG. 2, each reference marker area 6 is occupied by a reference marker pattern in the form of coarse and fine bars 7a and 7b respectively of a metal-based material, for example tantalum oxide. Each type of bar is arranged in two orthogonal groups. As shown in FIG. 3, the reference marker pattern 7 is provided on an oxide layer 9 which inhibits impurity diffusion into the substrate from the reference marker pattern during subsequent processing.

The reference marker pattern may be provided in the following manner.

Figure 4:
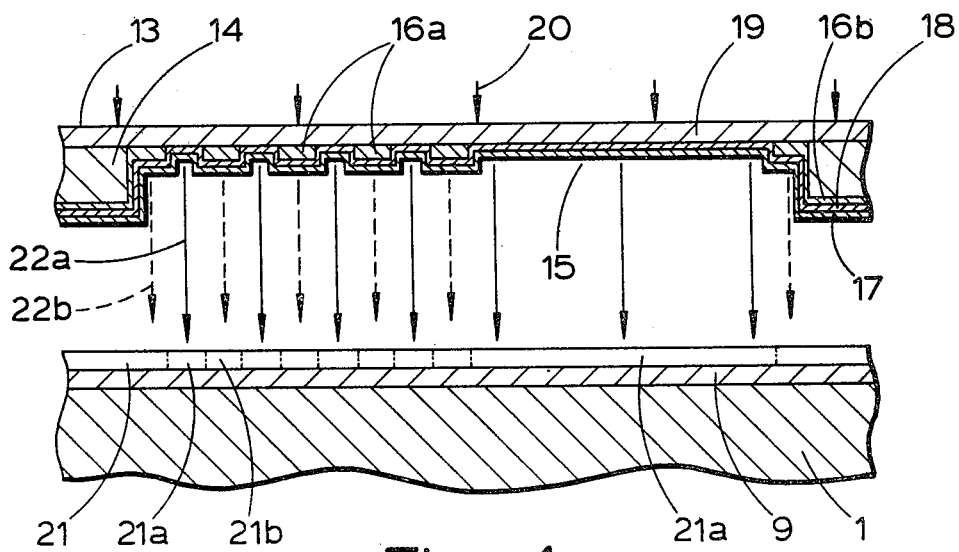
FIGS. 4 and 5 are cross-sectional view showing different stages during the formation of the reference marker pattern of FIG. 3.

The oxide layer 9 is provided on the surface of the wafer 1 by, for example, thermal oxidation to grow a silicon oxide layer having a thickness of, for example, 0.6 micron (see FIG. 4). The oxide layer 9 is then coated with a preliminary layer 21 of positive electron-sensitive resist such as poly methyl methacrylate (PMMA). The wafer is then mounted in a known electron image projector and the electron-sensitive resist layer 21 is exposed to a patterned electron beam 22a, 22b from a mask 13.

The mask 13 comprises a substrate 19 of, for example, quartz which is transparent to radiation 20 to be used. The substrate 19 has on its surface a layer pattern 14 of chromium which has a thickness of, for example, 1,000 angstroms and which defines an aperture 15. A layer 16a, 16b of chromium less than 400 angstroms thick and typically 200 angstroms thick is provided in the aperture 15 and on the layer pattern 14. The layer pattern 14 and the part 16b of the layer 16a, 16b together form a first layer pattern which is opaque to the radiation 20. The part 16a of the layer 16a, 16b, in the aperture 15 forms a second layer pattern. A transparent conductive layer 18 of, for example, chromium having a thickness of 80 angstroms covers the whole surface. The conductive layer 18 is coated with a layer 17 of photocathode material such as caesium iodide, which may be 200 angstroms thick.

When the mask 13 is illuminated with ultraviolet radiation 20 none of the radiation reaches the photocathode layer 17 on the opaque layer pattern 14, 16b so that no electron radiation emanates from this area of the mask. However, the ultraviolet radiation does penetrate other parts of the mask to different extents. As the density of the electrons emitted by the photocathode 17 depends on the intensity of the radiation incident on it, a first sub-pattern 22a of the electron beam emanates from the areas where the conductive layer 18 is present directly on the surface of the substrate 19 and a second sub-pattern 22b having a lower intensity than the sub-pattern 22a emanates from those areas where the second layer pattern 16a is present directly on the surface of the substrate 19. The first sub-pattern 22a is contained within the second sub-pattern 22b. It should be noted that, for the sake of clarity, the patterned electron beam has been represented by straight arrows, although in practice the electrons of the beam travel along helical paths through the usual electromagnetic and electrostatic fields generated in the vacuum chamber.

As shown in FIG. 4, the electron sensitive resist layer 21 is exposed to the radiation beam pattern 22a, 22b for a time which is sufficiently short such that on subsequent development only those areas 21a of the resist where the first sub-pattern 22a was incident are fully removed.

Figure 5:
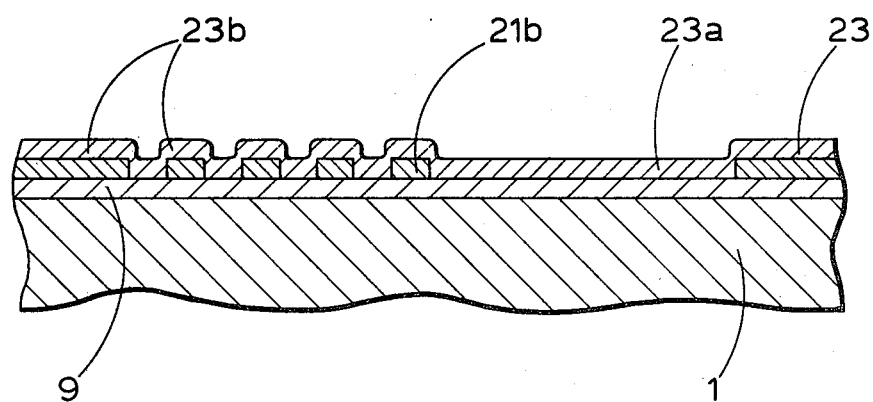

Afterwards a layer 23 of tantalum is sputter deposited on the surface to a thickness of, for example, 1000 angstroms (see FIG. 5). Parts 23b of the tantalum layer are deposited on the remaining parts 21b of the electron sensitive resist and parts 23a are deposited on the exposed surface of the oxide layer 9. The electron sensitive resist 21b is then dissolved away in known manner so that the parts 23b of the tantalum layer are removed leaving the parts 23a. The remaining parts 23a are oxidized, for example by heating to 1200° C. in dry oxygen for about 15 minutes to form the tantalum oxide reference marker pattern 7 as shown in FIG. 2.

In an alternative method of forming the reference marker pattern 7 a negative electron-sensitive resist such as polystyrene may be used. In this method a layer of tantalum is deposited directly on the surface of the oxide layer. The tantalum layer is then covered with electron resist which is exposed using the mask 13. The resist is developed so that the parts which were not exposed and the parts on which the second sub-pattern were incident are removed. The remaining electron-sensitive resist is used as an etchant mask in the definition of the reference marker pattern.

The mask 13 may be made as follows. A chromium layer is sputter deposited in known manner to a thickness of 1,000 angstroms onto the quartz substrate 1. An electron sensitive resist layer is deposited on the chromium layer and it is selectively exposed to an electron beam from a pattern generator in known manner so that after developing the electron-sensitive resist apertures are formed which expose the chromium so that it can be selectively removed by, for example, plasma etching to form the apertures 15 and the layer pattern 14. A layer of chromium is then sputter deposited to a thickness of 200 angstroms on the surface of the exposed substrate 19 and on the surface of the layer pattern 14. A negative electron sensitive resist such as polystyrene is coated over the chromium layer and it is exposed to an electron beam from an electron pattern generator so that after developing the electron sensitive resist the remaining part can be used as an etchant mask during etching of the chromium to leave the chromium layer pattern 16a and the part 16b. The whole surface is then provided with a conductive layer 18 by sputter depositing chromium to a thickness of, for example, 80 angstroms, after which the photocathode layer 17 of caesium iodide is deposited by evaporation in known manner.

A method in accordance with the invention may be used to define a protective layer over the reference marker pattern, as described below.

Figure 6:
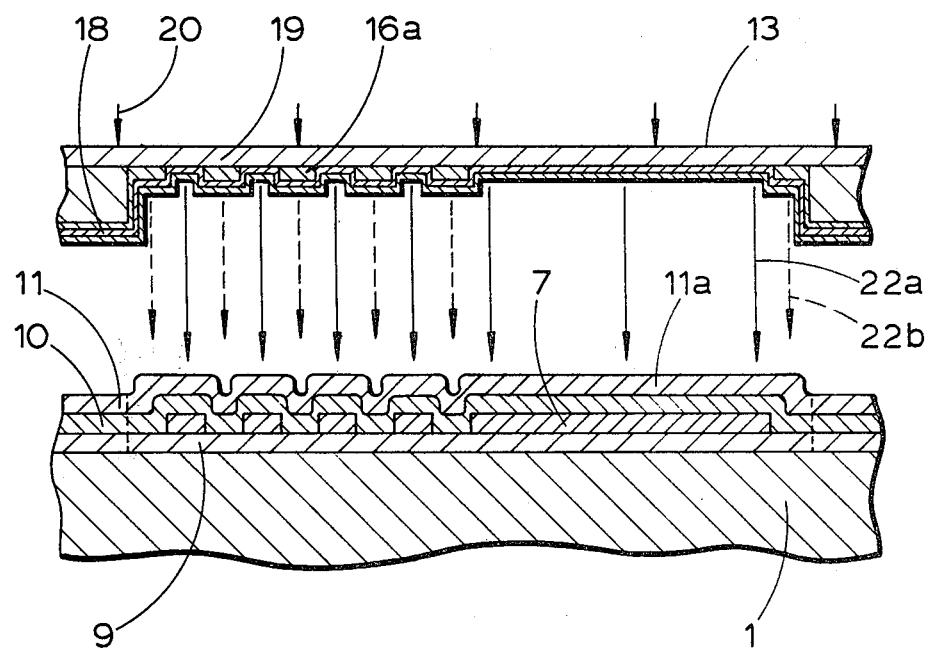
FIGS. 6 and 7 are cross-sectional views showing part of a mask and a semiconductor wafer at different stages of a method in accordance with the invention.

A layer 10 of material such as silicon nitride is deposited in known manner to a thickness of, for example, 0.15 micron over the tantalum oxide reference marker pattern 7 and the oxide layer 9 (see FIG. 6). A layer 11 of negative electron sensitive resist, such as polystyrene is then coated on the surface of the nitride layer 10. The semiconductor wafer 1 is then mounted in a known electron image projector with the mask 13. On illuminating the mask 13 with ultraviolet radiation 20 the electron sensitive resist 11 is exposed to a patterned electron beam 22a, 22b. As previously described the first sub-pattern 22a of the electron beam emanates from the areas of the mask where the conductive layer 18 is present directly on the surface of the substrate 19 and a second sub-pattern 22b emanates from those areas where the second layer pattern 16a is present directly on the surface of the substrate 19. The first sub-pattern 22a is contained within the second sub-pattern 22b. The patterned electron beam 22a, 22b is incident on the electron resist to expose it over the whole area 11a, thus determining the part of electron-sensitive resist which is to be removed and which is defined by the perimeter of the patterned electron beam. The difference in the intensity of the two sub-patterns is sufficient for the first sub-pattern 22a to be used to produce an X-ray signal from the reference marker pattern 7 and so to align automatically the patterned radiation beam from the mask with the wafer 1.

After alignment, exposure of the layer 11 of electron sensitive resist to the patterned radiation beam is continued so that when the resist is developed the part 11a covering the reference marker pattern is retained while the other parts are removed. Using known etching techniques in the presence of the electron sensitive resist masking layer 11a the nitride layer 10 and the oxide layer 9 are etched so that only the parts 9a and 10a of the protective layers remain (see FIG. 7).

In fact, the parts of the resist on which the first sub-pattern 22a are incident are over-exposed. However, because the first sub-pattern 22a is within the second sub-pattern 22b the additional exposure does not adversely affect the definition of the exposed area.

Figure 7:
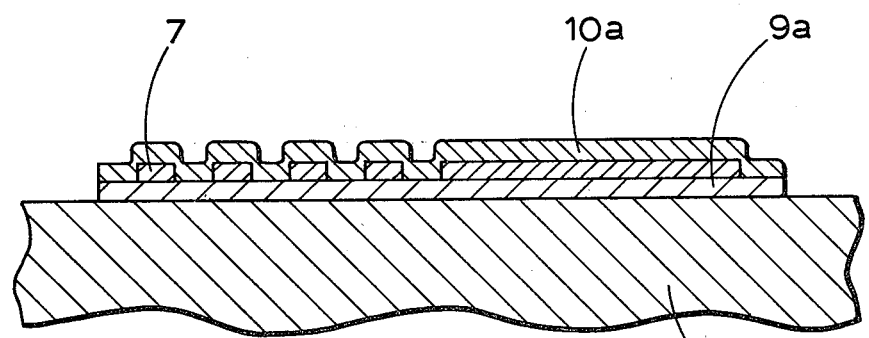

As shown in FIG. 7, the reference marker pattern 7 is enveloped between the two protective layers 9a and 10a. The nitride layer 10a may be provided, for example, to protect the tantalum reference marker pattern 7 during a later stage in the manufacture of the semiconductor device, for example during the removal of any surplus tantalum from the surface of the wafer. Alternatively, the layer 10a may be provided so that silicon can be grown epitaxially in its monocrystalline form on the areas 3 of the wafer and in its polycrystalline form on the protective layer 10a as described in U.K. Patent Specification No. 1,520,925. To re-expose the reference marker pattern so that it can be used for alignment at later stages in the manufacture of semiconductor devices the polycrystalline silicon can then be removed using an etchant which attacks the polycrystalline material faster than the monocrystalline material as described in U.K. Patent Specification No. 1,520,925.

Figure 8:
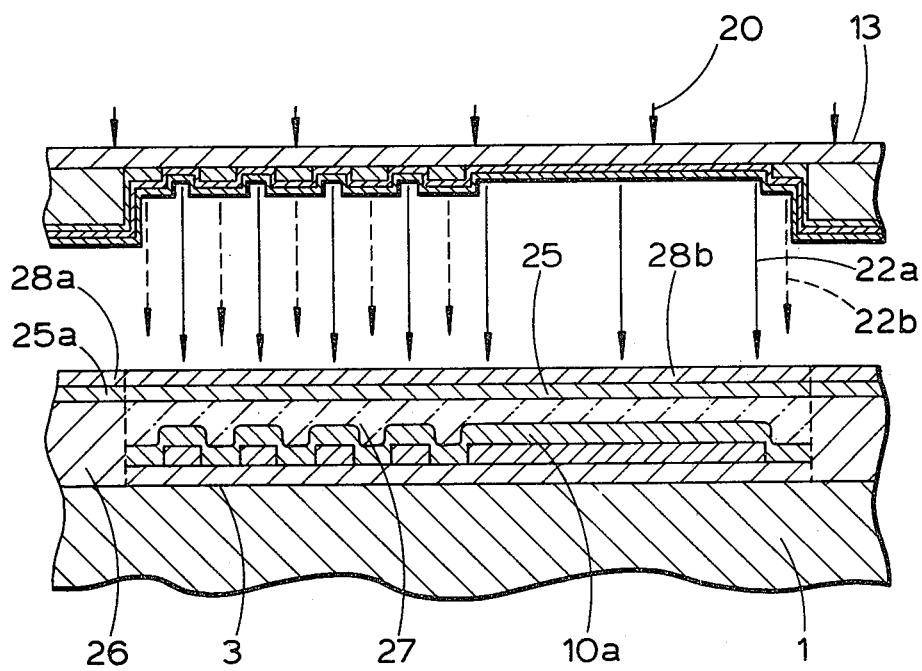
FIG. 8 is a cross-sectional view showing a part of a mask and a semiconductor wafer at a particular stage of a method in accordance with the invention.

FIG. 8 shows the polycrystalline silicon portion 27 grown on the silicon nitride layer 10a and the monocrystalline silicon portion 26 grown on the area 3 of the wafer outside the area of the reference marker pattern. As disclosed in United Kingdom Patent Specification No. 1,520,925 the surface of the monocrystalline material may be protected from the etchant by a protective layer of oxide 25a.

In a second embodiment of the invention a layer 28 of positive electron sensitive resist, such as PMMA, is deposited on the surface of an oxide layer 25. The oxide layer 25 is formed on the surface of both the polycrystalline silicon portion 27 and the monocrystalline portion 26, for example by oxidizing the surface. The oxide layer may be 0.6 micron thick. The mask 13 and the wafer 1 are then mounted in a known electron image projector and the resist layer 28 is exposed to the patterned electron beam 22a, 22b emanating from the mask 13 when it is illuminated with ultraviolet radiation 20. The patterned electron beam 22a, 22b is incident on the electron sensitive resist 28 to expose it over the whole area 28b, thus determining the area of electron resist which is to be removed and which is defined by the perimeter of the electron beam pattern. However, the difference in the intensity of the two sub-patterns is sufficient for the first sub-pattern 22a to be used to produce an X-ray signal from the reference marker pattern 7 and so to align automatically the mask 13 and the semiconductor wafer. Exposure is continued for a time sufficiently long that at the later development stage all of the resist 28b on which the electron beam 22a, 22b was incident is removed. The remaining parts 28a of the resist then mask the monocrystalline silicon parts 26 during etching of the polycrystalline silicon portion 27. By using this method the part 28b of the resist removed corresponds accurately to the area of the polycrystalline silicon portion 27 to be removed.

In the embodiments so far described the radiation sensitive material to be removed or retained has been limited to the area of the reference marker pattern. However, in a further embodiment of the invention a mask is used to define areas outside the area of and relative to the reference marker pattern 7 where further processing steps are to be carried out.

As shown in FIG. 9, the semiconductor wafer 1 has a tantalum oxide reference marker pattern 7 formed on an oxide layer 9. The reference marker pattern 7 and the oxide layer 9 are covered with a protective layer 10 of, for example, silicon nitride. Both protective layers 9 and 10 extend to the area 3 outside the area 6 of the reference marker pattern 7. The silicon nitride layer 10 is coated with a layer 31 of negative electron sensitive resist. The wafer 1 is then mounted in a known electron image projector with a mask 33. The mask may be made as described previously. However, the configuration of the first and second chromium layer patterns 34, 36b and 36a is different. The first layer pattern 34, 36b corresponds to those areas of the wafer 1 where a window is to be opened in the protective layer 9 and 10 for a further processing step to be carried out there. The areas of the mask where the layer pattern 34, 36b is not present correspond to the areas of the protective layers 9 and 10 on the wafer 1 to be retained. On illuminating the mask as before an electron beam 52a, 52b is produced. The higher intensity sub-pattern 52a again allows automatic alignment. The whole area 31c of the resist on which the electron beam patern 52a, 52b is incident is exposed to an extent that during a subsequent development step only the part of the resist 31d, where no electrons were incident, is removed. The remaining parts 31c of the resist can then be used as a mask during etching of the protective layers 9 and 10. After this etching step an aperture 35 is formed in the layers 9 and 10 as shown in FIG. 10. At the silicon surface exposed by the aperture a further processing step may be carried out. This may be, for example, the diffusion of an impurity or the localized formation of a partially buried oxide layer.

In a modified form of this embodiment the electron-sensitive resist may be a positive resist. The protective layer 10 can then be removed from the area of the reference marker pattern while at the same time apertures are formed in the protective layers 9 and 10 at areas outside the area of the reference marker pattern area where further processing steps are to be carried out.

Many modifications are possible within the scope of the invention. Thus, for example, a mask comprising more than two layer patterns may be used to produce a patterned radiation beam having more than two sub-patterns of different intensities.

Furthermore, patterned radiation beams other than patterned electron beams, for example visible light or X-rays, may be used for exposing the radiation sensitive material. In these cases the mask will not have a photocathode layer and the radiation will not be converted from one type on one side of the mask to another type on the other side. Instead of using a projection system in which the radiation sensitive material on the surface of the substrate is exposed through a mask spaced from the substrate, a system may be used in which the substrate and mask are in contact during the exposure.

I claim:

1. In a method of manufacturing a microminiature solid state device comprising the step of forming at least one reference marker pattern on a surface of a semiconductor substrate, the improvement comprising the steps of forming said reference marker pattern by exposing a layer of radiation sensitive material on said surface of said substrate to a patterned radiation beam from a mask, said mask passing a first sub-pattern of radiation and a second sub-pattern of radiation having a lower intensity than said first sub-pattern, said first sub-pattern being contained at least within a portion of said second sub-pattern, and said first sub-pattern having substantially the same configuration as said reference marker pattern, aligning said patterned radiation beam from said mask relative to said substrate so that said first sub-pattern is incident on said reference marker pattern, and continuing exposure of said layer to determine a portion of said layer for removal, said layer being defined by the perimeter of said patterned radiation beam.

2. A method according to claim 1, wherein said first sub-pattern of radiation is obtained through a first portion of said mask consisting essentially of a transparent mask substrate, a transparent conductive layer, and a photocathode layer, and wherein said second sub-pattern of radiation is obtained through a second portion of said mask consisting essentially of said transparent mask substrate, a patterned layer of such thickness to be relatively transparent, said conductive layer, and said photocathode layer.

3. A method according to claim 2, wherein remaining portions of said mask exclusive of said first and second portions are opaque.

4. A method according to one of claims 2 or 3, wherein said patterned layer of said second portion of said mask is chromium.

5. A method according to claim 4, wherein said remaining portions are of chromium of thicker amounts than said second portion.

6. A method according to claim 2, wherein said conductive layer is chromium.

7. A method according to claim 2, wherein said photocathode layer is a cesium iodide layer formed directly on said conductive layer.

8. A method according to claim 2, wherein said patterned radiation beam is an electron beam pattern generated by incidence of electromagnetic radiation through said mask on said photocathode layer.

9. A method according to one of claims 1 or 8, wherein said radiation sensitive material is an electron resist.

10. A method according to claim 9, wherein an X-ray signal is derived from incidence of said first sub-pattern of radiation on said reference marker pattern, said X-ray signal being used to automatically align said first sub-pattern relative to said substrate.

11. A method according to claim 1, wherein said layer of radiation sensitive material is a positive radiation sensitive material, and said layer is completely removed from the entire area of said reference marker pattern by developing.

12. A method according to claim 1, wherein said layer of radiation sensitive material is a negative radiation sensitive material, and said layer is completely removed from areas outside of said reference marker pattern by developing.

13. A method according to claim 1, wherein portions of said layer outside of said reference marker pattern define an aperture corresponding to an area of said substrate where other processing steps may be effected.

14. A method according to claim 1, wherein said reference marker pattern is obtained by the steps of exposing a preliminary layer of said radiation sensitive material to said patterned radiation beam, developing said preliminary layer to completely remove a portion defined by the perimeter of said first sub-pattern, and forming said reference marker pattern at locations defined by remaining portions of said preliminary layer.

* * * * *